(12) United States Patent
Taskin et al.

(10) Patent No.: US 8,704,577 B2
(45) Date of Patent: Apr. 22, 2014

(54) CLOCK MESH SYNTHESIS WITH GATED LOCAL TREES AND ACTIVITY DRIVEN REGISTER CLUSTERING

(75) Inventors: Baris Taskin, Philadelphia, PA (US); Jianchao Lu, Sunnyvale, CA (US)

(73) Assignee: Drexel University, Philadelphia, PA (US)

( * ) Notice: Subject to any disclaimer, the term of this patent is extended or adjusted under 35 U.S.C. 154(b) by 58 days.

(21) Appl. No.: 13/480,769

(22) Filed: May 25, 2012

(65) Prior Publication Data

US 2012/0299627 A1 Nov. 29, 2012

Related U.S. Application Data

(60) Provisional application No. 61/490,785, filed on May 27, 2011.

(51) Int. Cl.
*G06F 1/04* (2006.01)
*H03K 3/00* (2006.01)

(52) U.S. Cl.
USPC ........... 327/293; 327/291; 327/294; 327/296; 716/6

(58) Field of Classification Search
USPC ................ 327/165, 166, 291–299, 374, 178; 326/93–98; 716/6
See application file for complete search history.

(56) References Cited

U.S. PATENT DOCUMENTS

| | | | |
|---|---|---|---|
| 7,089,510 B2 * | 8/2006 | Correale et al. | 716/133 |
| 7,111,266 B2 * | 9/2006 | Correale et al. | 716/113 |
| 7,448,007 B2 * | 11/2008 | Alpert et al. | 716/114 |
| 7,600,203 B2 * | 10/2009 | Nonaka | 716/136 |
| 7,890,905 B2 * | 2/2011 | Alpert et al. | 716/113 |
| 8,228,107 B2 * | 7/2012 | Kao | 327/298 |
| 2008/0016479 A1 * | 1/2008 | Alpert et al. | 716/6 |

OTHER PUBLICATIONS

Abdelhadi et al., "Timing-Driven Variation-Aware Nonuniform Clock Mesh Synthesis," Proceedings of the Great Lakes Symposium on VLSI (GLSVLSI), May 2010, 15-20.
Chaturvedi et al., "An Efficient Merging Scheme for Prescribed Skew Clock Routing," IEEE Transactions on Very Large Scale Integration (VLSI) Systems, Jun. 2005, 13(6) 750-754.
Chen et al., "An Algorithm for Zero-Skew Clock Tree Routing With Buffer Insertion," Proceedings of the European Conference on Design and Test (ED&TC), Mar. 1996, 230-236.

(Continued)

*Primary Examiner* — Lincoln Donovan
*Assistant Examiner* — Brandon S Cole
(74) *Attorney, Agent, or Firm* — Woodcock Washburn, LLP (57) ABSTRACT

A clock mesh network synthesis method is proposed which enables clock gating on the local sub-trees of the clock mesh network in order to reduce the clock power dissipation. Clock gating is performed with a register clustering strategy that considers both i) the similarity of switching activities between registers in a local area and ii) the timing slack on every local data path of the design area. The method encapsulates the efficient implementation of the gated local trees and activity driven register clustering with timing slack awareness for clock mesh synthesis. With gated local tree and activity driven register clustering, the switching capacitance on the mesh network can be reduced by 22% with limited skew degradation. The method has two synthesis modes as low power mode and high performance mode to serve different design purposes.

9 Claims, 7 Drawing Sheets

(56) References Cited

OTHER PUBLICATIONS

Cho et al., "Novel Binary Linear Programming for High Performance Clock Mesh Synthesis," Proceedings of the IEEE/ACM International Conference on Computer-Aided Design (IC-CAD), 2010, 438-443.

Cong et al., "Bounded-Skew Clock and Steiner Routing," ACM Transactions on Design Automation of Electronic Systems (TODAES), 1998, 3( 3), 341-388.

Elmore, "The Transient Response of Damped Linear Networks With Particular Regard to Wideband Amplifiers," Journal of Applied Physics (AIP), Jan. 1948, 19(1), 55-63.

Guthaus, et al., "Non-Uniform Clock Mesh Optimization With Linear Programming Buffer Insertion," Proceedings of the ACM/IEEE Design Automation Conference (DAC), Jun. 2010, 74-79.

Lu, et al., "Timing Slack Aware Incremental Register Placement With Non-Uniform Grid Generation for Clock Mesh Synthesis," Proceedings of the International Symposium on Physical Design (ISPD), Mar. 2011, 131-138.

Rajaram et al., "Meshworks: An Efficient Framework for Planning, Synthesis and Optimization of Clock Mesh Networks," in Asia and South Pacific Design Automation Conference (ASPDAC), Jan. 2008, 250-257.

Shelar, "An Algorithm for Routing With Capacitance/Distance Constraints for Clock Distribution in Microprocessors," Proceedings of the International Symposium on Physical Design (ISPD), Mar. 2009, 141-148.

Tsay, "Exact Zero Skew," IEEE International Conference on Computer—Aided Design (ICCAD), Nov. 1991, 336-339.

Venkataraman et al., "Combinatorial Algorithms for Fast Clock Mesh Optimization," IEEE Transaction on Very Large Scale Integration Systems (TVLI), Jan. 2010 18( 1), 131-141.

\* cited by examiner

CLOCK MESH SYNTHESIS WITH GATED LOCAL TREES AND ACTIVITY DRIVEN REGISTER CLUSTERING

CROSS-REFERENCE TO RELATED APPLICATIONS

The present application claims priority to U.S. Provisional Patent Application No. 61/490,785, filed May 27, 2011. The contents of that application are hereby incorporated by reference.

TECHNICAL FIELD

The present invention relates to clock network structures for high-end microprocessor designs and, more particularly, to a clock network structure that uses gated local trees in a clock mesh network.

BACKGROUND

A clock mesh network has been the preferred clock network structure for high-end microprocessor design because of its tolerance to variations. The variation tolerance is achieved by having the redundant mesh grid wires near the sink registers at the cost of power dissipation. Although other clock structures with redundancy such as clock spines and cross links exist, these structures only improve the tolerance to local skew variation. A clock mesh network, by design, has a very low global clock skew (variation). As such, the clock mesh network is popular in high-end microprocessors and, consequently, many known design automation methods have been developed in the area of clock mesh synthesis and optimization. In such prior art systems, the methods proposed aim to reduce the power dissipation given a practical skew requirement. For instance, the methods described by Venkataraman, Feng, Hu, and Li in "Combinatorial algorithms for fast clock mesh optimization," IEEE Transactions on Very Large Scale Integration Systems (TVLSI), Vol. 18, No. 1, pp. 131-141, January 2010 and by Abdelhadi, Ginosar, Kolodny, and Friedman in "Timing-driven variation-aware nonuniform clock mesh synthesis," Proceedings of the Great Lakes Symposium on VLSI (GLSVLSI), May 2010, pp. 15-20, and the methods described by Shelar in "An algorithm for routing with capacitance/distance constraints for clock distribution in microprocessors," in Proceedings of the International Symposium on Physical Design (ISPD), March, 2009, pp. 141-148, and by Guthaus, Wilke, and Reis in "Non-uniform clock mesh optimization with linear programming buffer insertion," Proceedings of the ACM/IEEE Design Automation Conference (DAC), June 2010, pp. 74-79 aim to reduce the mesh grid wires and stub wires, respectively, whereas the methods described by Rajaram and Pan in "Meshworks: An efficient framework for planning, synthesis and optimization of clock mesh networks," in Asia and South Pacific Design Automation Conference (ASPDAC), January 2008, pp. 250-257; Cho, Pan and Puri in "Novel binary linear programming for high performance clock mesh synthesis," Proceedings of the IEEE/ACM International Conference on Computer-aided Design (IC-CAD), 2010, pp. 438-443; and Lu, Mao, and Taskin in "Timing slack aware incremental register placement with non-uniform grid generation for clock mesh synthesis," Proceedings of the International Symposium on Physical Design (ISPD), March 2011, pp. 131-138 aim to reduce the sum of the mesh grid wires and stub wires.

Although optimizing for power dissipation, none of these disclosures has considered the commonly used power saving techniques for clock tree network such as clock gating and register clustering on meshes. In the clock mesh network, the clock gating is only potentially applicable on the local connections between the mesh grid wires and the sink registers. In the prior art, the stub wires that connect the grid wires to the sink registers are considered buffer-less where clock gating is inapplicable. A significant percentage of the switching capacitance (30-70%) is at the sinks of the clock network; therefore, clock gating on the local trees of a clock mesh is beneficial. As will be explained herein, it is desired in accordance with the method of the invention to connect the sink registers using local steiner trees and to insert the integrated clock gating cells (ICG) for power saving purposes.

SUMMARY

In most prior art clock networks, sink registers are connected to the mesh grid wires individually. In the aforementioned article by Shelar, steiner tree connections are used to connect registers to the mesh grid wires. In accordance with the method of the invention, the steiner tree connection is used to connect registers and thus the clock routing wirelength will be reduced by register clustering. Since inserting an ICG cell occupies chip area, it is generally desirable that the number of inserted ICG cells is minimal. Accordingly, a register clustering based on the switching activity and timing slack information is considered in accordance with the method of the invention to further reduce the power dissipation and number of inserted ICG cells under a given clock skew requirement. The advantages of the clock mesh network generated by the method of the invention include at least the following:

1) The power consumption of the clock mesh network is reduced compared to previous clock mesh design methods due to the combination of clock gating, steiner tree connection and the register clustering.

2) The non-negative timing slack of the circuit is preserved after the incremental register placement. The slack decrease tolerance can be specified by the designer.

3) The incremental register placement is performed in local areas only, which preserves the placement optimization in terms of timing and routing.

In an exemplary embodiment, a method is provided for generating a clock mesh network with gated local trees connecting registers with similar switching activities together. In the exemplary embodiment, such method includes the steps of:

building feasible moving regions of each register based on timing slack of each local data path in the clock mesh network;

based on the feasible moving regions of each register, clustering the registers with small distance and similar switching activities together;

incrementally moving the registers in the same clusters towards each other to provide non-negative timing slack; and generating the clock mesh network with local trees and performing integrated clock gating cell insertion to save power dissipation.

The method is further characterized in that the registers are clustered together further based on the distance of the feasible moving regions of registers and total switching capacitance after clustering. Also, a local area may be defined as one grid box and only the clusters inside the one grid box are merged together. In a low performance mode, an integrated clock gating cell is inserted on each cluster, while in a high performance mode, a balanced capacitance is further provided at each gate of the integrated clock gating cell on each cluster. It is also desirable to apply overlapping avoidance constraints to prevent overlapping of registers.

Such methods of the invention are used to create a clock network characterized by a clock mesh network comprising a plurality of connectors connected in a grid configuration, a local tree network comprising a plurality of connectors connected in a steiner tree configuration and connected to the clock mesh network, and clock gating circuits comprising logic gates located at cluster points in the steiner tree configuration and responsive to control signals so as to selectively enable or disable the propagation of signals through circuit paths in the steiner tree configuration connected by the logic gates. Preferably, each cluster point is located where a cluster of circuits has a same switching activity and such that a desired timing of the propagation of signals through the circuit paths is satisfied. In an exemplary embodiment, a single integrated clock gating cell is provided for driving the registers in a cluster in a low performance mode. In a high performance mode, a balanced capacitance is further provided at each gate of the integrated clock gating cell on each cluster.

BRIEF DESCRIPTION OF THE DRAWINGS

The foregoing and other beneficial features and advantages of the invention will become apparent from the following detailed description in connection with the attached figures, of which:

FIG. 1(a) illustrates a traditional clock mesh network, while

FIG. 3(a) illustrates the decomposition of the delay in a data path, while

DETAILED DESCRIPTION OF ILLUSTRATIVE EMBODIMENTS

The present invention may be understood more readily by reference to the following detailed description taken in connection with the accompanying figures and examples, which form a part of this disclosure. It is to be understood that this invention is not limited to the specific products, methods, conditions or parameters described and/or shown herein, and that the terminology used herein is for the purpose of describing particular embodiments by way of example only and is not intended to be limiting of any claimed invention. Similarly, any description as to a possible mechanism or mode of action or reason for improvement is meant to be illustrative only, and the invention herein is not to be constrained by the correctness or incorrectness of any such suggested mechanism or mode of action or reason for improvement. Throughout this text, it is recognized that the descriptions refer both to methods and hardware designed in accordance with such methods.

A detailed description of illustrative embodiments of the present invention will now be described with reference to FIGS. 1-5. Although this description provides a detailed example of possible implementations of the present invention, it should be noted that these details are intended to be exemplary and in no way delimit the scope of the invention.

Overview

In physical IC design, uniform clock meshes are generally preferred since the mesh grid can be placed between the uniform power rails to prevent crosstalk. The invention follows this principle of utilizing uniformly placed tracks as potential candidates for clock mesh grid synthesis.

Figure 1A:
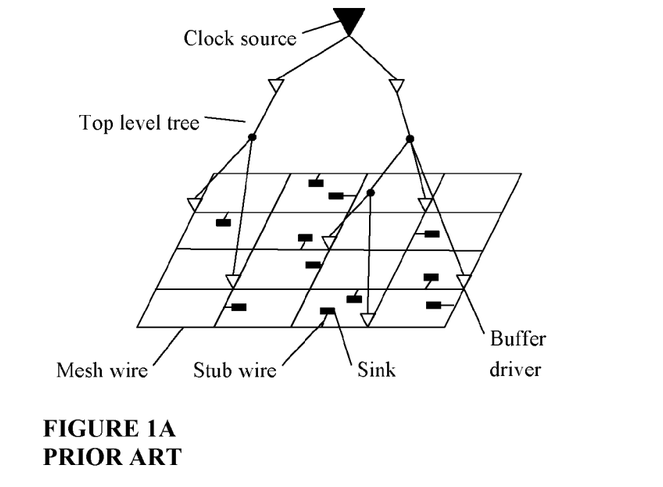
Figure 1B:
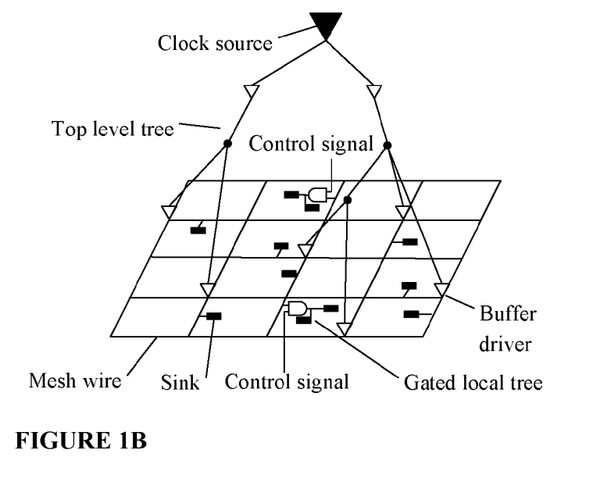
FIG. 1(b) illustrates a clock mesh network with gated local trees in accordance with an embodiment of the invention.

The traditional clock mesh network, as shown in FIG. 1(a), consists of the horizontal and vertical mesh wires, the stub wires connecting the sink registers to the mesh wires, and the top level buffered clock tree that drives the capacitive mesh wires, stub wires and sink registers. The clock mesh network in accordance with the invention is shown in FIG. 1(b). The clock mesh network of the invention is advantageous in that the registers are connected to the grid wires using tree-like connections and buffering elements such as integrated clock gating (ICG) cells that are allowed to be inserted at the subtree roots.

As will be explained in more detail below, the two primary metrics when designing clock networks like the one illustrated in FIG. 1(b) are the total switching capacitance (impacting power) and the clock skew (impacting performance).

A. Switching Capacitance on the Mesh Network

The switching capacitance is adopted herein as a measurement of dynamic power dissipation on the clock network. Assume the capacitance $c_i^t$ is the total stub wire capacitance on the sub-tree $t_i$ and the capacitance $c_k^r$ is the input capacitance of the register $r_k$. The total switching capacitance $c_{total}$ (excluding the top level clock tree) on a mesh network can be calculated as:

$$C_{total} = c_{mesh} + \sum_{\forall t_i} \alpha_i \left( c_i^t + C_{ICG} + \sum_{\forall r_k \in t_i} c_k^r \right) \quad (1)$$

where $\alpha_i$ and $C_{ICG}$ are the switching factor of the sub-tree $t_i$ and the capacitance of the clock gating cell, respectively.

Without clock gating, the switching capacitance of the clock network contributed by the mesh and stub wires is proportional to the total wirelength. In order to reduce the power consumption on the clock mesh, the prior art methods noted above reduce the mesh grid wirelength and the stub wirelength. However, considering clock gating, the switching capacitance can be reduced by reducing both the switching factor and the wirelength. The method of the invention reduces the stub wirelength and the switching factor by register clustering, steiner tree-like stub wire connections, and clock gating to reduce the total switching capacitance.

B. Clock Skew on Clock Mesh Network

In the aforementioned article by Rajaram and Pan, the global clock skew $t_{skew}$ on a mesh network is estimated as:

$$t_{skew} = t_{skew}^{buf} + D_{mesh}(d_{max}) + D_{stub}(L_{stub}^{max}), \quad (2)$$

where $t_{skew}^{buf}$, $D_{mesh}(d_{max})$ and $D_{stub}(L_{stub}^{max})$ are the skew introduced by the buffer drivers of the mesh, the maximum delay on the mesh from a buffer driver to a stub wire tapping point, and the maximum delay from a tapping point to the sink registers, respectively. In Equation (2), the skew introduced by the buffer driver $t_{skew}^{buf}$ (the first item) can be compensated using the prescribed skew tree generation method described by Chaturvedi and Hu in "An efficient merging scheme for prescribed skew clock routing," IEEE Transactions on Very Large Scale Integration (VLSI) Systems, Vol. 13, No. 6, pp.

750-754, June 2005, when synthesizing the top level clock tree. Increasing the number of buffer drivers also improves $t_{skew}^{buf}$ through improving the driving strength of the mesh; however, this approach has a penalty in increased power consumption. Inserting more buffer drivers reduces the second term $D_{mesh}(d_{max})$. The skew introduced by the third term $D_{stub}(L^{max}_{stub})$ is affected by the capacitance and the topology of the sub-tree that connects the tapping points to the sink registers.

In the method of the invention, the skew introduced by the third term in Equation 2 is primarily considered when generating the local sub-trees and inserting clock gating cells as the first two terms can be optimized during the top level tree generation. As such, the skew requirement as used herein refers to the skew introduced by the third term. The method of the invention guarantees the skew introduced by the local gated sub-trees is within a given limit.

C. Static Timing Constraints

A local data path $R_i \rightarrow R_f$ consists of two registers $R_{i(initial)}$ and $R_{f(final)}$ and a combinational logic path. The minimum and maximum propagation delays on the combinational block are denoted by $D_{PMin}$ and $D_{PMax}$, respectively. The clock-to-output delay of a register $R_i$ is denoted by $D_{CQ}^i$, whereas $S_f$ is the setup time of the register $R_f$. The parameters $t_i$ and $t_f$ represent the clock delays to registers $R_i$ and $R_f$, respectively and the clock period is denoted by T.

The timing analysis of a synchronous circuit is performed by satisfying the setup and hold timing constraints for each local data path:

$$\text{Setup: } t_i + D_{CQ}^i + D_{PMax}^{if} \leq t_f + T - S_f = L_{if}, \quad (3)$$

$$\text{Hold: } t_i + D_{CQ}^i \pm D_{PMin}^{if} \geq t_f \quad (4)$$

The setup timing slack is more critical since the hold violations can be fixed by inserting delays on a data-path. The timing slack $L_{if}$ on each timing path $R_i \rightarrow R_f$ of the circuit can be calculated as:

$$L_{if} = T - S_f - D_{CQ}^i - D_{PMax}^{if}. \quad (5)$$

Clocking Methodologies

Figure 2:
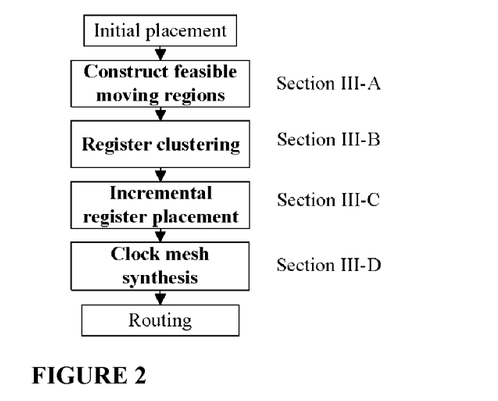
FIG. 2 illustrates a method connecting registers with similar switching activities together in accordance with an embodiment of the invention.

The method of the invention generates a clock mesh network with gated local trees as shown in FIG. 1(b). The local trees connect registers with similar switching activities together. The method of the invention includes the four major steps illustrated in FIG. 2:

(1) Build the feasible moving regions of each register based on the timing slack of each local data path on the design;

(2) Based on the feasible moving regions of each register, cluster the registers with small distance and similar switching activity together;

(3) Incrementally move the registers in the same clusters towards each other to guarantee non-negative timing slack; and.

(4) Generate the clock network with local trees and perform ICG insertion to save power dissipation.

These four steps are described in the following sections A-D, respectively.

A. Generating the Feasible Moving Regions (FMR)

Figure 3A:
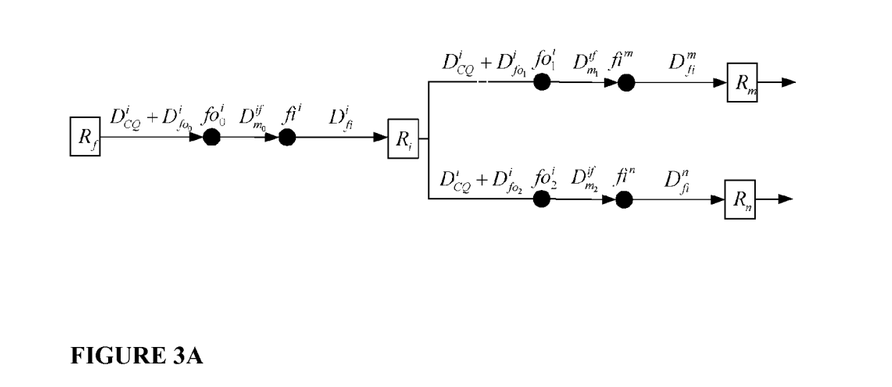

The method of the invention suggests the incremental placement of the registers towards each other in the same cluster to reduce the ICG cells insertion. The timing slacks are considered during the incremental placement (movement) of the registers in order to guarantee the functionality correctness of the design. The feasible moving region (FMR) of each register is thus defined based on the timing path to guide the register clustering and incremental placement. Note that the timing slack of a register-to-register path $R_i \rightarrow R_f$ is associated with the physical paths on the register-to-register (timing) path. The incremental placement of the registers affects the locations of the registers but not the combinational logic gates constituting the physical paths. Consequently, incremental register placement changes the slack of the entire timing path; however, only the physical paths at the fanout of the initial register $R_i$ and the fanin of the final register $R_f$ are affected. The remaining physical paths between the combinational gates remain unaffected. To this end, the data-path delay $D_{PMax}^{if}$ is decomposed into three parts:

$$D_{PMax}^{if} = D_{fo_k}^i + D_{m_k}^{if} + D_{fi_k}^f, \quad (6)$$

as illustrated in FIG. 3(a). $D_{fo_k}^i$ is the wire delay from the output of the register $R_i$ to the input of the $k^{th}$ fanout gate of the register $R_i$. $D_{m_k}^{if}$ is the gates and wire delay from the input of the $k^{th}$ fanout gate of the register $R_i$ to the input of the fanin gate of register $R_f$. $D_{fi_k}^f$ is the gate and wire delay from the input of the fanin gate of register $R^f$ to the input of the register $R_f$.

The timing slack of the local data-path can be re-written as:

$$L_{if} = T - S_f - D_{CQ}^i - D_{m_k}^{if} - D_{fi_k}^f - D_{fo_k}^i. \quad (7)$$

At the post placement stage, the clock period T and each part of the original data-path delay $D_{m_k}^{if}$, $D_{fo_k}^i$, and $D_{fi_k}^f$ are known. In order to guarantee the functional correctness under variation, the timing slack $L_{if}$ of each register timing path $R_i \rightarrow R_f$ should be non-negative or greater than a positive value specified by the designer). If the register $R_i$ is moved, the fanout wirelength $w_{fo_k}^i$ of the register $R_i$ will change thus the delay $D_{fo_k}^i$ on the $k^{th}$ fanout wire and the clock to output delay of the register $D_{CQ}^i$ will change as the load capacitance changes. For the same reason, if the location of the register $R_f$ is changed, the delay $D_{fi_k}^f$ on the fanin path of the register $R_f$ changes.

The delays $(D_{fo_k}^i + D_{CQ}^i)$ and $D_{fi_k}^f$ are monotonically increasing functions of fanout wirelength $w_{fo_k}^i$ and fanin wirelength $w_{fi}^f$, respectively. Given a positive slack, a maximum fanout wirelength $W_{fo_k}^i$ and fanin wirelength $W_{fi}^i$ can be calculated for each register $R_i$. As long as the manhattan distance of the register $R_i$ is less than the maximum fanout wirelength $W_{fo_k}^i$ to the corresponding fanout gates and the maximum fanin wirelength $W_{fi}^i$ to the fanin gate, the timing slack of the registers is guaranteed to be feasible with the adapted timing models.

Figure 3B:
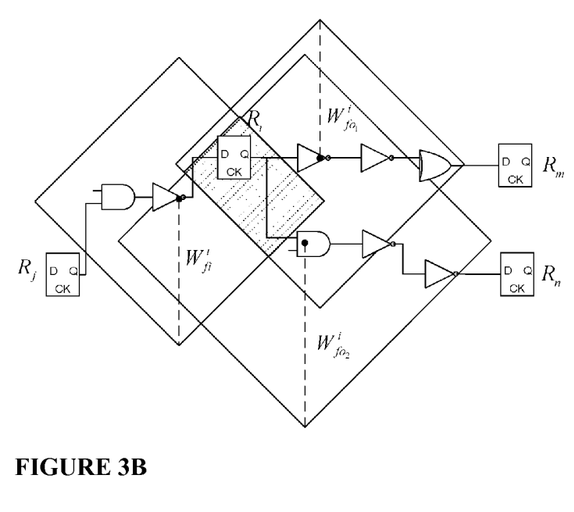
FIG. 3(b) illustrates the feasible moving region of a register within a timing budget in an exemplary embodiment.

The feasible moving regions for each fanout and fanin gates of register $R_i$ are created based on $W_{fo_k}^i$ and $W_{fi}^i$, respectively. For instance, at the location of the $k^{th}$ fanout gate of register $R_i$, a tilted rectangle with radius $W_{fo_k}^i$ is created as shown in FIG. 3(b) such that the manhattan distance from the register $R_i$ to the gate is equal to $W_{fo_k}^i$ on the boundary of the region. As long as the register is placed within the created tilted rectangle region, the timing slack on the $k^{th}$ fanout path is satisfied. For each fanout and fanin gate of register $R_i$, a feasible rectangle region is created. The shaded overlapping region of all the tilted rectangle regions of the fanin and fanout gates of register $R_i$ is defined as the feasible moving region of register $R_i$ as shown in FIG. 3(b). It is important to note that the moving region construction is not very accurate as when one register is moved, the slack of the other register which has a data-path to the moved register changes. In other words, the feasible region of movement generated at this stage for each register $R_i$ is valid when the rest of the registers are unmoved. Thus, in this stage, only the so called feasible moving region is created; the register placement will be performed at a later stage guaranteeing the positive timing slack.

B. Activity Driven Register Clustering

After generating the feasible moving regions of the registers, the registers are clustered together based on the distance of the feasible moving regions (FMR) of registers, similarity in switching activities and total switching capacitance after clustering. In a later stage, the registers in the same cluster are incrementally moved close to each other to save routing wirelength considering positive timing slack. The registers in the same cluster are driven by a single ICG cell.

1) Clusters Merging in Local Areas:

Initially, each register on the design area is a cluster by itself. During the clusters merging step, registers inside one local area with feasible moving regions close to each other and similar switching activities are merged together. In this method, the local area is defined as one grid box, that is, only the clusters inside one grid box are allowed to be merged.

In the merging process, two capacitance cost metrics are defined for each cluster $G_i$ $G_i$: Switching capacitance $c_i^s$ $c_i^s$ and un-buffered capacitance $c_i^u$ $c_i^u$. The switching capacitance $c_i^s$ $c_i^s$ of a cluster is the minimum capacitance after making a clock gating decision. The switching capacitance $c_i^s$ $c_i^s$ is the same as the un-buffered capacitance $c_i^u$ $c_i^u$ if clock gating does not reduce the total switching capacitance.

At the beginning, the merging regions of the registers (initial clusters) are the feasible moving regions (FMR) of the registers created in the previous stage. The merging cost is defined as the minimum total switching capacitance after merging the two clusters. At each merging step, the switching capacitance and the un-buffered capacitance are updated for the newly merged cluster. For instance, if two clusters $G_i$ $G_i$ and $G_j$ $G_j$ are merged to form the new cluster, $G_v$ the un-buffered capacitance $c_v^u$ $c_v^u$ and the switching capacitance of $c_v^s$ $c_v^s$ are calculated as:

$$c_v^u = c_i^u + c_j^u + C d_{ij}. \quad (8)$$

$$c_v^s = \min[c_v^u, (c_v^u + C_{ICG})\alpha_v], \quad (9)$$

where $c$ and $d_{ij}$ $d_{ij}$ are the unit wire capacitance and the minimum distance between the merging regions $MR_i$ $MR_i$ and $MR_j$ $MR_j$ of clusters $G_i$ and $G_j$ $G_j$, respectively.

Figure 4:
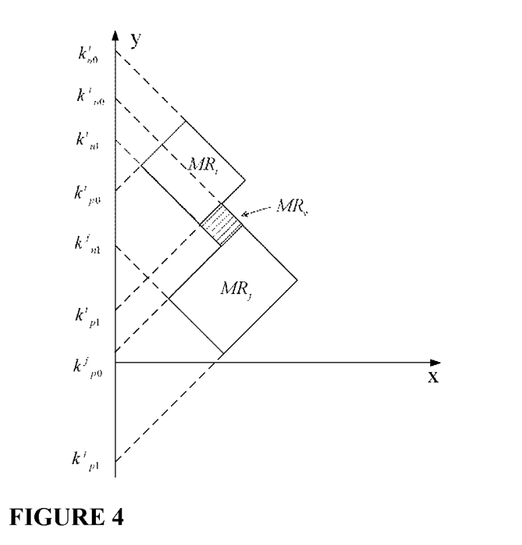
FIG. 4 illustrates a physical construction of the merging regions of the registers (initial clusters) in the circuit paths.

The merging regions are physically constructed as shown in FIG. 4. Assume $MR_i$ $MR_i$ and $MR_j$ $MR_j$ are the merging regions of the cluster $G_i$ $G_i$ and $G_j$, $G_j$ respectively. The two clusters are merged to form a new cluster $G_v$ $G_v$. Without loss of generality, assume each merging region is a tilted rectangle region. Each rectangle can thus be represented by its four edges represented as $y=x+k_{p0}^i$, $y=x+k_{p1}^i$, $y=-x+k_{n0}^i$ and $y=-x+k_{n1}^i$ $y=-x+k_{n1}^i$, where two lines have the slope +1 and two lines have the slope −1. In the two tilted rectangle regions (two merging regions $MR_i$ $MR_i$ and $MR_j$ $MR_j$), there are four edges with the same slope +1 and different k-values as $k_{p0}^i$ $k_{p0}^i$, $k_{p1}^i k_{p1}^i$, $k_{p0}^j k_{p0}^j$ and $k_{p1}^j k_{p1}^j$. Also, there are four edges with the same slope −1 and different k-values as $k_{n0}^i, k_{n1}^i, k_{n0}^j$ and $k_{n1}^j$. The region constrained by the two lines that have the k-values in the middle among $k_{p0}^i, k_{p1}^i, k_{p0}^j, k_{p1}^j$ for positive slope edges and the two lines that have the k-values in the middle among $k_{n0}^i, k_{n1}^i, k_{n0}^j, k_{n1}^j$ for negative slope edges is the merging region $MR_v$ $MR_v$ for the newly merged cluster $G_v$ $G_v$. For instance, in FIG. 4, the region constrained by the four lines $y=x+k_{p1}^i$, $y=x+k_{p0}^j$, $y=-x+k_{n1}^i$ and $y=-x+k_{n0}^j$ $y=-x+k_{n0}^j$ is the merging region $MR_v$ $MR_v$ for the new cluster $G_v$ $G_v$.

In the above example, the merging region construction is explained for the case of merging two non-overlap tilted rectangle regions. In fact, the above method can be applied to the merging of any lines, points or tilted rectangle regions with or without overlaps. Note that a line segment is in fact a merging region with either two positive edges having the same k-values or two negative edges having the same k-values. A point is a merging region with two positive edges having the same k-values and two negative edges having the same k-values. The merging method of the invention guarantees that at any point inside the newly merged region, the sum of the minimum distance from the point to the merging region $MR_i$ $MR_i$ and the merging region $MR_j$ $MR_j$ is equal to the minimum distance $d_{ij}$ $d_{ij}$ between $MR_i$ $MR_i$ and $MR_j$ $MR_j$, which guarantees the minimum un-buffered capacitance $c_v^u$ $c_v^u$ for the clusters $G_v$ $G_v$. The merging region construction greedily forms new clusters such that the total switching capacitance of each cluster is minimized.

2) Register Cluster Generation:

In order to generate the register clusters and guarantee the incremental register placement is minimal, the merging of the clusters is restrained to be within one grid box. The clustering algorithm is an iterative algorithm that is performed for each grid box. In each iteration, the two clusters with the minimum merging cost, defined as the total switching capacitance after merging, is merged. After each merging step, a gating decision is made on the newly merged clusters to determine whether to insert an ICG cell for reducing $c_v^s$ $c_v^s$. Then these clusters are connected to the mesh grid to generate a complete mesh routing solution. The total switching capacitance of all the clusters and stub wires is calculated as $c_{prev}^{total}$ $c_{prev}^{total}$. The merging stops when the merging of the clusters does not reduce the total switching capacitance inside the grid box. An exemplary register clustering algorithm is presented in Algorithm 1 below.

---

Algorithm 1 Register clustering algorithm.

Input: Merging region $MR_i$ for each register $R_i$ and grid size M * N.
Output: The cluster set G = {$G_1, G_2 \ldots G_m$}

1:     Initialize each register $R_i$ as a cluster $G_i$;
2:     for Each grid box $B_k$ do
3:         Initialize the cluster set $GB_k = \{G_x | R_x \in B_k\}$;
4:         $c_{prev}^{total} = c_{cur}^{total} = \sum_{\forall G_x \in GB_k} c_x^s$ $c_{prev}^{total} = c_{cur}^{total} = \sum_{\forall G_x \in GB_k} c_x^s$
5:         while $c_{cur}^{total} \leq c_{prev}^{total}$ $c_{cur}^{total} \leq c_{prev}^{total}$ do
6:             $c_{prev}^{total} = c_{cur}^{total}$ $c_{prev}^{total} = c_{cur}^{total}$
7:             Find the clusters $G_i$ $G_i$ and $G_j$ $G_j$ in $GB_k$ $GB_k$ such that $c_v^s$ $c_v^s$ is the minimum;
8:             if $c_v^u > C_{limit}$ $c_v^u > C_{limit}$ then
9:                 break;
10:            end if
11:            Generate merging region $MR_v$ $MR_v$ from $MR_i$ $MR_i$ and $MR_j$ $MR_j$;

| | Algorithm 1 Register clustering algorithm. |
|---|---|
| 12: | $c_v^u = c_i^u + c_j^u + Cd_{ij\ c_v^u \leftarrow c_i^u + c_j^u + Cd_{ij}}$; |
| 13: | $c_v^s = \min\square[c_v^u, (c_v^u + C_{ICG})\alpha_v]\ c_v^s = \min[c_v^u, (c_v^u + C_{ICG})\alpha_v]$; |
| 14: | $G_v = G_i \cup G_{j\ G_v \leftarrow G_i \cup G_j}$; |
| 15: | $GB_k = GB_k - \{G_i\}, GB_k = GB_k - \{G_j\}, GB_k = GB_k \cup G_{v\ GB_k \leftarrow GB_k - \{G_i\},\ GB_k \leftarrow GB_k - \{G_j\},\ GB_k \leftarrow GB_k \cup G_v}$; |
| 16: | $c_{cur}^{total} = \sum_{\forall G_x \in GB_k} c_x^s\ c_{cur}^{total} = \sum \forall G_x \in GB_k\ c_x^s$ |
| 17: | end while |
| 18: | $G = G \cup GB_{k\ G \leftarrow G \cup GB_k}$; |
| 19: | end for |

3) High Performance Mode:

The clustering method of the invention is developed with the power dissipation minimization objective. As such, the number of ICGs inserted is limited, which causes clock skew (e.g. between local clusters with and without clock gating ICGs). A method to reduce the clock skew is to insert ICG cell on each cluster. This alternative method potentially increases the area and power, but balances the clock skew. In order to the reduce clock skew for this method (inserting gates on all clusters), another requirement is to have relatively balanced capacitance for each gate. The merging cost is changed to unbuffered capacitance instead of switching capacitance and a capacitance limit $C_{limit}$ on each cluster will be placed as shown in Step 8 of Algorithm 1. Note that the capacitance limit $C_{limit}$ is defined based on the skew requirement.

The register cluster generation method described above is considered the low power (LP) mode while the variation discussed in this section is considered the high performance (HP) mode of the method of the invention.

C. Incremental Register Placement

During the register clustering phase, the registers are clustered but their positions are not changed. In this step, the registers are incrementally placed considering the timing slack of the design. Since moving one register potentially changes the feasible moving regions of the other registers that have a path to the moved register, the incremental placement is a combinational optimization problem. The scalability of the solution or the runtime are not major concerns as the sizes of the individual linear programming formulations are limited to the number of clock sinks in each grid box. The problem is solved using a linear programming formulation. The objective and the constraints of the formulation are explained in the following sections.

1) Objective:

The objective is to minimize the distance between the registers inside the same cluster. This is such as the registers of the same cluster are merged during the local tree generation and this will reduce the routing wirelength during the local tree generation. Let $x_{Ri}$ and $y_{Ri}$ be the x and y coordinates of the register $R_i$, the objective becomes the following:

$$\text{minimize} \sum_{\forall G_{k_\forall}} \sum_{(R_i, R_j) \in G_k} dist(R_i, R_j), \quad (10)$$

$$dist(R_i, R_j) = |x_{R_i} - x_{R_j}| + |y_{R_i} - y_{R_j}|. \quad (11)$$

2) Timing Constraints:

As discussed in generating the feasible moving regions, the delay $D_{fo_k}^i + D_{CQ}^i$ and $D_{fi_k}^f D_{fi_k}^f$ will be changed by incrementally moving the registers $R_i$ $R_i$ and $R_f$ $R_f$ respectively. In the method of the invention, the delay changes on the wire and the gate are conservatively modeled using linear functions:

$$D_{fo_k}^i = K_w C w_{fo_k}^i, \quad (12)$$

$$D_{CQ}^i = D_{RO}^i + K_r^i C w_{fo_k}^i, \quad (13)$$

$$D_{fi_k}^f = K_w C w_{fi_k}^f + D_{GO}^f + K_G^f C w_{fi_k}^f, \quad (14)$$

where C C is the unit wire capacitance. The parameters $K_w$ $K_w$, $K_r^i K_r^i$ and $K_G^f K_G^f$ are the slopes of the wire delay versus wire capacitance curve, register delay versus capacitive load curve and the fanin gate delay of register $R_f$ $R_f$ versus the capacitive load, respectively. The parameters $D_{RO}^i D_{RO}^i$ and $D_{GO}^f D_{GO}^f$ are the clock-to-output delay and the gate delay when the capacitive load is zero (0). The wirelength $w_{fo_k}^i w_{fo_k}^i$ and $w_{fi_k}^f w_{fi_k}^f$ can be estimated using the distances of the fanout and fanin gate to the register:

$$w_{fo_k}^i = |x_{R_i} - x_{fo_k}^i| + |y_{R_i} - y_{fo_k}^i|, \quad (15)$$

$$w_{fi}^f = |x_{R_f} - x_{fi}^f| + |y_{R_f} - y_{fi}^f|, \quad (16)$$

where $x_{fo_k}^i x_{fo_k}^i$ and $y_{fo_k}^i y_{fo_k}^i$ and $x_{fi}^f x_{fi}^f$ and $y_{fi}^f y_{fi}^f$ are the x and y locations of the $k^{th}$ $k^{th}$ fanout gate of register $R_i$ $R_i$ and the fanin gate of the register $R_f$ $R_f$, respectively. The linear approximation of the delay change on the wire and the gates is conservative because the delay typically is modeled quadratically, e.g. Elmore delay as described by Elmore in "The transient response of damped linear networks with particular regard to wideband amplifiers," Journal of Applied Physics (AIP), Vol. 19, No. 1, pp. 55-63, January 1948. The utilized linear approximation uses a pessimistic slope value to guarantee the estimated (linear) delay is always higher than the higher order models. Alternative delay modeling can be performed for increased accuracy. The design method of the invention is based on linear programming; therefore, the linear delay model is selected to generate linear constraints. The conservative modeling estimates the wire and gate delays to be higher, which provides conservative but guaranteed timing constraints. The difference in overestimation is available as a positive timing slack after incremental placement, which is favorable for a practical operation.

Figure 5:
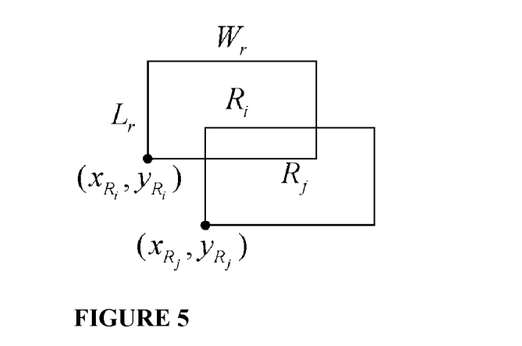
FIG. 5 illustrates the undesirable overlap of registers.

3) Physical Constraints:

Simultaneous with these requirements in timing, the physical requirement in preventing the overlapping of registers is considered. As shown in FIG. 5, let the length and width of a register be $L_r$ and $W_r$, respectively. One of the following four overlapping avoidance constraints has to be satisfied in order to guarantee there is no overlapping between each pair of registers $R_i R_i$ and $R_j R_j$:

$$x_{R_i} - x_{R_j} \geq W_r \quad (17)$$

$$x_{R_j} - x_{R_i} \geq W_r \quad (18)$$

$$y_{R_i} - y_{R_j} \geq L_r \quad (19)$$

$$y_{R_j} - y_{R_i} \geq L_r \quad (20)$$

These constraints prevent the horizontal and vertical overlapping of register placement based on the register length and width. The constraints in Equations (17) and (18) are mutually exclusive, similar to the constraints in Equations (19) and (20). In order to form a linear programming formulation for the problem, only one of the four constraints is placed in the formulation between each pair of registers $R_i$ and $R_j$. To this end, the constraints are generated based on the original relative positions of the registers. For instance, if registers $R_i$ and $R_j$ are within one cluster and their original coordinates have the following relationship $y_i < y_j$, the Equation (20) is set as the non-overlapping constraint for these two registers. Constraints on the y axis are preferred as the height of the cell is often smaller. These constraints consider the overlap between registers. The overlaps between registers and logic gates are resolved using placement legalization.

4) Linear Programming Formulation:

The overall linear programming formulation is presented in Table I. The objective of the formulation is to minimize the distance between registers inside the same cluster. The timing constraints and the overlapping constraints are generated. Note that xdist(a, b) and ydist(a, b) represent the distance between nodes a and b on the horizontal direction and vertical direction, respectively. The constraints about xdist(a, b) and ydist(a, b) are used to linearize the distance constraints. For each register pair, at most one constraint among the last four constraints presented as "or" appears in the linear programming formulation. By solving the formulation, the optimal locations $(\hat{x}_{R_i}, \hat{y}_{R_i})$ $(\hat{x}_{R_j}, \hat{y}_{R_j})$ of each register $R_i$ for the distance minimization of the registers in the same cluster are obtained.

TABLE I

THE LINEAR PROGRAMMING FORMULATION FOR INCREMENTAL REGISTER PLACEMENT.
Minimize the distances between registers in the same cluster.

$$\sum_{\forall G_k} \sum_{(R_i, R_j) \in G_k} \left( |x_{R_i} - x_{R_j}| + |y_{R_i} - y_{R_j}| \right)$$

min
s.t. $D_{fo_k}^i + D_{CQ}^i + D_{fi_k}^f \leq T - S_f - L_{if} - D_{m_k}^{if}, \forall (R_i \rightarrow R_j)$
$D_{fo_k}^i = K_w C w_{fo_k}^i, \forall R_i$
$D_{CQ}^i = D_{R0}^i + K_r^i C w_{fo_k}^i, \forall R_i$
$D_{fi_k}^f = K_w C w_{fi_k}^f + D_{G0}^f + K_G^f C w_{fi_k}^f, \forall R_f$
$w_{fo_k}^i = \text{xdist}(R_i, \text{fo}_k) + \text{ydist}(R_i, \text{fo}_k), \forall R_i$
$\text{xdist}(R_i, \text{fo}_k) \geq x_{R_i} - x_{fo_k}, \forall R_i$
$\text{xdist}(R_i, \text{fo}_k) \geq x_{fo_k} - x_{R_i}, \forall R_i$
$\text{ydist}(R_i, \text{fo}_k) \geq y_{fo_k} - y_{R_i}, \forall R_i$
$w_{fi}^f = \text{xdist}(R_f, \text{fi}) + \text{ydist}(R_f, \text{fi}), \forall R_f$
$\text{xdist}(R_f, \text{fi}) \geq x_{R_j} - x_{fi}, \forall R_f$
$\text{xdist}(R_f, \text{fi}) \geq x_{fi} - x_{R_f}, \forall R_f$
$\text{ydist}(R_f, \text{fi}) \geq y_{R_j} - y_{fi}, \forall R_f$
$\text{ydist}(R_f, \text{fi}) \geq y_{fi} - y_{R_f}, \forall R_f$
$x_{R_i} - x_{R_j} \geq W_r,$
or $x_{R_j} - x_{R_i} \geq W_r,$
or $y_{R_i} - y_{R_j} \geq L_r,$
or $y_{R_j} - y_{R_i} \geq L_r,$ D. Clock Mesh Synthesis with Gated Local Trees Given the new locations of the sink registers and the clusters generated, the clock mesh network of the invention is synthesized. The grid size of the final mesh network is the same as the grid size during the register clustering stage which is optimized using the method described by Rajaram and Pan. The local clock tree generation stage is similar to the traditional method for zero skew clock trees as described by Tsay in "Exact zero skew," in IEEE International Conference on Computer-Aided Design (ICCAD), November 1991, pp. 336-339, except that the merging cost is defined as the delay from the root of the newly merged tree to the sink registers. The algorithm is described in Algorithm 2 below. In this algorithm, only the sink registers inside the same cluster are allowed to be merged. The whole clock mesh network is generated in the order of i) mesh grid wire generation, ii) gated local tree generation for each cluster and connecting the gated local trees to the mesh grid wires, and iii) top level clock tree generation.

Algorithm 2 Clock mesh synthesis.

Input: The cluster set $G = \{G_1, G_2 \ldots G_m\}$ and the locations of all registers.
Output: The clock mesh network.
1:  for each cluster $G_k$ do
2:    Initialize each register $R_i$ in $G_k$ as sub-tree root $t_i$ such that $c_i^u = c_i, d_i = 0$
3:    Update sub-tree roots set $T = \{t_x | R_x \in G_k\}$;
4:    while $|T| > 1$ do
5:      Find the newly merged sub-tree root $t_v$ from merging $t_i$ and $t_j$ such that the delay $d_v$ is the minimum
6:      Generate sub-tree $t_v$, update $d_v$ and $c_v^u$;
7:      $T = T - \{t_i\}, T = T - \{t_j\}, T = T \cup t_v$;

8:      $$c_{cur}^{total} = \sum_{\forall G_x \in GB_k} c_x^s$$

9:    end while
10:   Connect he root of $t_v$ to the closest grid segment;
11:   Top-down Embedding from root $t_v$ [20];
12: end for
13: Insert buffer drivers at the intersections of the grid wires;
14: Generate the top level buffered clock tree;

Results

The algorithm flow described above is implemented in C++ on a suitable microprocessor in an exemplary embodiment. The top level clock tree is generated using a buffered DME algorithm as described by Cong, Kahng, Koh, and Tsao in "Bounded-skew clock and steiner routing," ACM Transactions on Design Automation of Electronic Systems (TODAES), Vol. 3, NO. 3, pp. 341-388, 1998, and by Chen and Wong in "An algorithm for zero-skew clock tree routing with buffer insertion," in Proceedings of the European Conference on Design and Test (ED&TC), March, 1996, pp. 230-236, to drive the mesh grid. *IC Compiler of Synopsys* is used to perform the initial placement and routing. The linear programming formulations are solved by the on-line solver Feaspump and SCIP from NEOS Solvers, http://neos.mcs.anl.gov/neos/solvers/. Since the benchmark circuits provided by the ISPD'10 clock network contest do not have any logic gate information, the benchmark circuits used in the experiments are the five largest circuits from the ISCAS'89 benchmark. As reference, note that the register count for the largest ISCAS'89 circuit is in the same level with the ISPD'10 contest benchmark (1728 vs. 2249).

The switching capacitance of the clock mesh network synthesized by the method of the invention has been compared against the method described by Rajaram and Pan, which is implemented such that it generates a mesh network with minimum capacitance under a skew requirement using uniform mesh grid wires. The mesh reduction is not considered in the experimental results. However, the same mesh reduction method (or any other alternative) can be applied on the method of the invention, where two synthesis modes are implemented:

1) Low Power (LP) Mode: The method of the invention inserts clock gating cells on the local trees only if it reduces the switching capacitance given a skew requirement.

2) High Performance (HP) Mode: The method of the invention inserts clock gating cells and buffers on all the local sub-tree roots to balance the clock skew introduced by the buffering elements (ICG or buffer)

Performance results are summarized in Table II. In the experimental embodiments, the whole clock networks including gated local trees, mesh grid wires, buffer drivers and top level clock trees were synthesized using the method of the invention. The generated trees were transformed into the equivalent RC model, same as the procedure in the ISPD'10 clock network contest, where Ngspice is performed to analyze the final clock skew. By using the LP mode, the switching capacitance is reduced by 22.1% compared to the method of Rajaram and Pan. The clock skew is increased in the LP mode because the clock gating cells are not inserted on all the sub-trees. The skew is increased by 3.8% of the clock period (500 ps) compared to the previous method. However, the overall clock skew is limited to be within only 7% of the clock period. By using the HP mode, on the other hand, the switching capacitance reduction is 9.5%, which is less than LP mode. The skew degradation is only 4.6 ps, which is 0.9% of the clock period. The clock networks synthesized using HP mode thus have very low clock skew degradation and still achieve a reasonable power reduction.

The timing slack is guaranteed to be non-negative (or a positive value specified by the designer) by the linear programming formulation. In reality, the timing slack might be improved due to the incremental register placement. In the experiments, four out of the five benchmark circuits have improvements on timing slack range from 2 ps to 22 ps. Only one out of the five circuits has timing slack reduction of 16 ps. On average, the timing slack is improved by 8 ps due to the register placement. The trade-off effect of applying the method of the invention is the increased cell area due to the ICG gates insertion as shown in Table III. The second and third columns show the number of gates inserted for the two different modes. The HP mode inserts more gating cells and the area increase is more, which is 4.7% on average. However, it is observed that the average area increase on the experimental circuits is within 5% of the cell area, which is very limited. As clock gating is done independently for each grid box, circuit scaling is not expected to increase by this area overhead. The register incremental movement is constrained to be within a grid box, which suggests very limited register displacement. It is observed that the average register movement is only 2.7 $W_r$, where $W_r$ is the width of the registers.

TABLE II

THE COMPARISON OF SWITCHING CAPACITANCE AND CLOCK SKEW.

| | | Switching capacitance | | | | | Global clock skew | | | | |
|---|---|---|---|---|---|---|---|---|---|---|---|
| Circuit | Grid | [9] (pF) | LP mode (pF) | Reduction | HP mode (pF) | Reduction | [9] (ps) | LP mode (ps) | Increase | HP mode (ps) | Increase |
| s13207 | 7 * 7 | 17.5 | 13.4 | 22.9% | 15.5 | 10.9% | 10.3 | 33.3 | 4.6% | 15.5 | 1.1% |
| s15850 | 7 * 7 | 13.8 | 10.5 | 23.1% | 12.3 | 10.1% | 5.2 | 35.3 | 6.0% | 15.0 | 2.0% |
| s35932 | 14 * 14 | 47.2 | 36.9 | 21.6% | 42.9 | 9.1% | 14.7 | 33.7 | 0.0% | 17.0 | 0.5% |
| s38417 | 14 * 14 | 44.8 | 35.1 | 21.5% | 40.9 | 8.5% | 14.1 | 34.4 | 4.1% | 17.8 | 0.8% |
| s38584 | 11 * 11 | 32.1 | 25.2 | 21.4% | 29.0 | 9.2% | 14.5 | 35.3 | 4.2% | 16.4 | 0.4% |
| Average | | | | 22.1% | | 9.5% | | | 3.8% | | 0.9% |

TABLE III

THE TRADE-OFF EFFECTS.

| | Gates insertion | | Area increase | | Reg move |
|---|---|---|---|---|---|
| Circuit | LP (#) | HP (#) | LP (%) | HP (%) | $\times W_r$ |
| s13207 | 224 | 342 | 3.5% | 5.3% | 3.1 |
| s15850 | 198 | 263 | 2.8% | 3.7% | 2.6 |
| s35932 | 669 | 957 | 4.4% | 6.3% | 2.0 |
| s38417 | 605 | 862 | 4.0% | 5.7% | 2.2 |
| s38584 | 434 | 600 | 1.8% | 2.5% | 3.6 |
| Average | | | 3.3% | 4.7% | 2.7 |

Thus, the low power clock mesh synthesis method described herein allows clock gating on local trees and clusters the registers considering the switching activities and the timing slacks of all the local data-paths. The method of the invention has two modes: low power mode and high performance mode. The power reduction is realized by register clustering and clock gating. In an exemplary embodiment, the method is preferably implemented as a practical way of generating clock mesh networks for high performance ICs.

Those skilled in the art also will readily appreciate that many additional modifications are possible in the exemplary embodiment without materially departing from the novel teachings and advantages of the invention. Accordingly, any such modifications are intended to be included within the scope of this invention as defined by the following exemplary claims.

What is claimed:

1. A clock network comprising:
   a clock mesh network comprising a plurality of connectors connected in a grid configuration;
   a local tree network comprising a plurality of connectors connected in a steiner tree configuration and connected to the clock mesh network; and
   clock gating circuits comprising logic gates located at cluster points in said steiner tree configuration and responsive to control signals so as to selectively enable or disable the propagation of signals through circuit paths in said steiner tree configuration connected by said logic gates, each cluster point being located where a cluster of circuits has a same switching activity and such that a desired timing of the propagation of signals through said circuit paths is satisfied.

2. The network of claim 1, further comprising a single integrated clock gating cell for driving the registers in a cluster of circuits.

3. The network of claim 2, further comprising a balanced capacitance at each gate of said integrated clock gating cell on said cluster.

4. A method of generating a clock mesh network with gated local trees connecting registers with similar switching activities together, comprising:
   building feasible moving regions of each register based on timing slack of each local data path in the clock mesh network;
   based on the feasible moving regions of each register, clustering the registers with small distance and similar switching activities together;
   incrementally moving the registers in the same clusters towards each other to provide non-negative timing slack; and
   generating the clock mesh network with local trees and performing integrated clock gating cell insertion to save power dissipation.

5. The method of claim 4, wherein the registers are clustered together further based on the distance of the feasible moving regions of registers and total switching capacitance after clustering.

6. The method of claim 5, wherein a local area is defined as one grid box and only the clusters inside the one grid box are merged together.

7. The method of claim 4, further comprising inserting an integrated clock gating cell on each cluster.

8. The method of claim 7, further comprising providing balanced capacitance at each gate of said integrated clock gating cell on said cluster.

9. The method of claim 4, further comprising applying overlapping avoidance constraints to prevent overlapping of registers.

* * * * *